(12) United States Patent
Kakinoki

(10) Patent No.: US 7,049,690 B2
(45) Date of Patent: May 23, 2006

(54) INFORMATION CARD

(75) Inventor: Wataru Kakinoki, Yokohama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 650 days.

(21) Appl. No.: 09/802,680

(22) Filed: Mar. 9, 2001

(65) Prior Publication Data

US 2001/0022394 A1    Sep. 20, 2001

(30) Foreign Application Priority Data

Mar. 9, 2000    (JP)    ............................. 2000-065594

(51) Int. Cl.
*H01L 23/495* (2006.01)

(52) U.S. Cl. ................... 257/679; 257/680; 257/681

(58) Field of Classification Search ................ 257/679, 257/678, 680; 438/46
See application file for complete search history.

(56) References Cited

U.S. PATENT DOCUMENTS

| | | | |
|---|---|---|---|
| 4,052,243 A | 10/1977 | Yazawa et al. | |
| 5,486,131 A | 1/1996 | Cesna et al. | |
| 5,527,424 A | 6/1996 | Mullins | |
| 5,596,486 A * | 1/1997 | Young et al. ............... | 361/737 |
| 5,611,943 A | 3/1997 | Cadien et al. | |
| 5,643,044 A | 7/1997 | Lund | |
| 5,655,951 A | 8/1997 | Meikle et al. | |
| 5,664,987 A | 9/1997 | Renteln | |
| 5,692,947 A | 12/1997 | Taileh et al. | |
| 5,707,492 A | 1/1998 | Stager et al. | |
| 5,759,089 A | 6/1998 | McCoy | |
| 5,775,983 A | 7/1998 | Shendon et al. | |
| 5,779,526 A | 7/1998 | Gill | |
| 5,785,585 A | 7/1998 | Manfredi et al. | |
| 5,830,043 A | 11/1998 | Aaron et al. | |
| 5,860,853 A | 1/1999 | Hasegawa et al. | |
| 5,934,974 A | 8/1999 | Tzeng | |
| 5,961,372 A | 10/1999 | Shendon | |
| 5,980,368 A | 11/1999 | Chang et al. | |
| 5,997,384 A | 12/1999 | Balock | |
| 6,039,633 A | 3/2000 | Chopra | |
| 6,093,080 A | 7/2000 | Inaba et al. | |
| 6,108,209 A * | 8/2000 | Cox et al. ................... | 361/737 |
| 6,125,041 A * | 9/2000 | Yoshikawa et al. ......... | 361/737 |
| 6,312,319 B1 | 11/2001 | Donohue et al. | |
| 6,320,252 B1 * | 11/2001 | Potters et al. ................ | 257/679 |
| 6,590,778 B1 * | 7/2003 | Hojo et al. .................. | 361/737 |
| 2003/0013384 A1 | 1/2003 | Donohue et al. | |

FOREIGN PATENT DOCUMENTS

| | | |
|---|---|---|
| EP | 0770455 A1 | 2/1997 |
| EP | 96307780.5 | 5/1997 |

(Continued)

*Primary Examiner*—Hoai Pham
*Assistant Examiner*—Nathan W. Ha
(74) *Attorney, Agent, or Firm*—Keating & Bennett, LLP

(57) ABSTRACT

An information card includes a ground plate that is connected to a ground conductor portion of a printed substrate and is integral with an external panel. Plural contacts are provided with the ground plate, and are exposed at the upper side out of windows provided in the external panel. Lead terminals are extended from the ground plate and are integral therewith, and the tips of the lead terminals are soldered to the ground conductor portion of the printed substrate.

15 Claims, 16 Drawing Sheets

FOREIGN PATENT DOCUMENTS

| | | |
|---|---|---|
| JP | 05057606 A | 3/1993 |
| JP | 6-030860 | 4/1994 |
| JP | 6-309517 | 11/1994 |
| JP | 7-037671 | 7/1995 |
| JP | 7-192105 | 7/1995 |
| JP | 7-242084 | 9/1995 |
| JP | 8-058276 | 3/1996 |
| JP | 9-054818 | 2/1997 |
| JP | 9-058163 | 3/1997 |
| JP | 9-315062 | 12/1997 |
| JP | 9-327989 | 12/1997 |
| JP | 10029157 A | 2/1998 |
| JP | 10-075082 | 3/1998 |
| JP | 10233421 A | 9/1998 |
| JP | 11-175686 | 7/1999 |
| JP | 2000-163541 | 6/2000 |

* cited by examiner

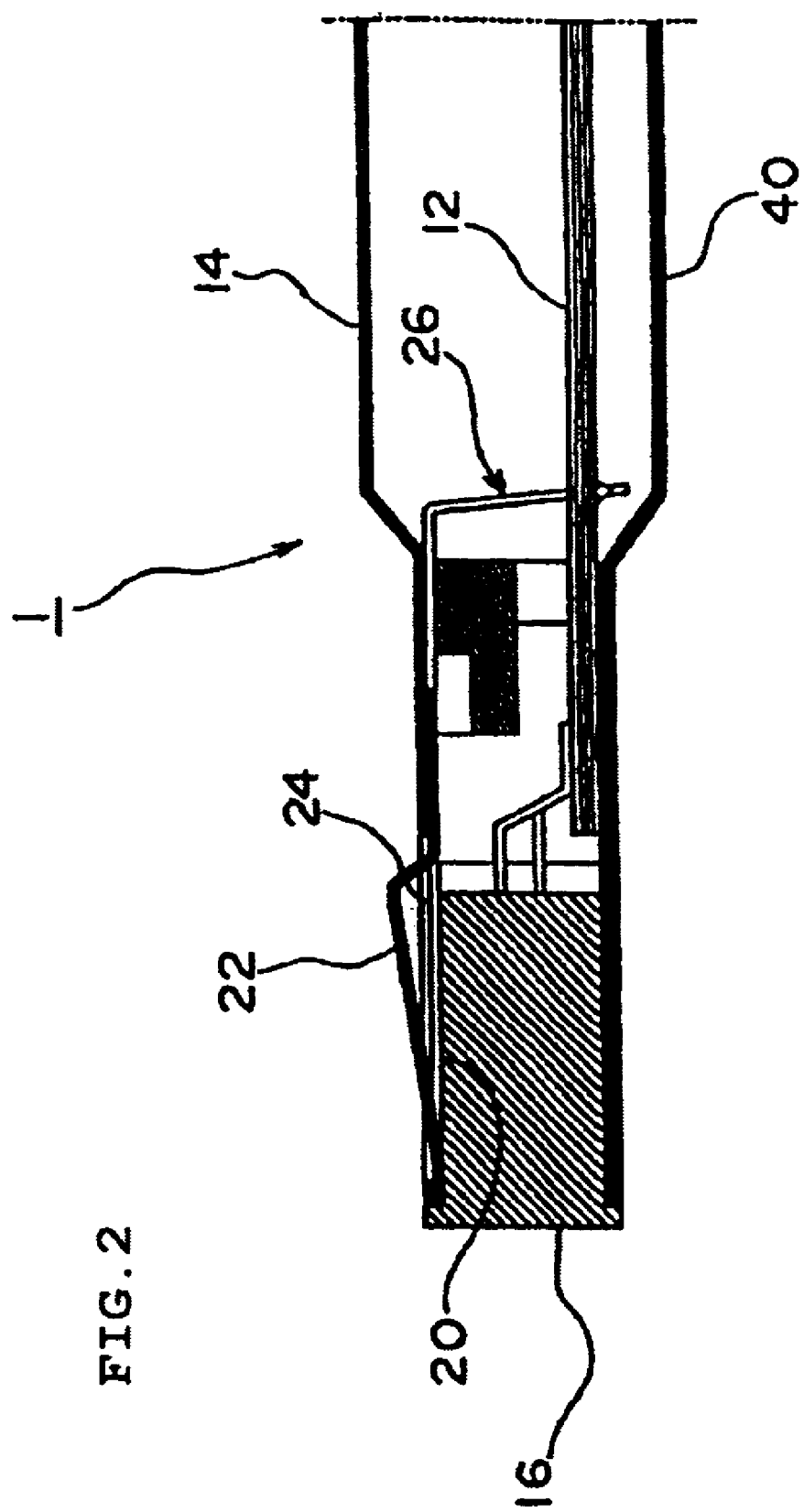

INFORMATION CARD

BACKGROUND OF THE INVENTION

1. Field of the Invention

The present invention relates to an information card for use in a computer and computer peripheries and peripheral apparatuses.

2. Description of the Related Art

In recent years, information cards (feature-expansion cartridges), which are card type external circuits for expansion of features such as memory media or other suitable features, have been used. An example of the information cards is a PC card in compliance with Card Standard specified by Personal Computer Card International Association (PCMCIA).

As shown in FIG. 16, a conventional PC card 501 includes a printed substrate 512 having electronic components mounted thereto, a front connector 516 to connect the PC card to a computer, a frame 510 to enclose the periphery of the printed substrate 512, a pair of frame ground terminals 518 (hereinafter, referred to as FG terminal) fixed to the frame 510 for enhancing grounding of the printed substrate 518 and the computer, a ground plate 520 for enhancing grounding near the front connector 516, a front-surface external panel 514 for covering the frame 510, and a back-surface external panel (not shown).

In above-described PC card 501, the FG terminal 518, the ground plate 520, and the external panel 514 are defined by discrete members which causes an increase in the number of components of the PC card. Moreover, terminals extending from the FG terminals 518 and the ground plate 520 must be soldered to the printed substrate 512, which increases the number steps required to produce the PC card, thereby increasing production costs.

SUMMARY OF THE INVENTION

To overcome the above-described problems with the prior art, preferred embodiments of the present invention provide an information card having a reduced number of components and which requires fewer steps to produce, thus greatly reducing the cost of producing the information card.

According to a preferred embodiment of the present invention, an information card includes a ground member that is integral with a conductor and defined by an external panel, the ground member being connected to a ground conductor portion of a circuit substrate contained in the information card and being externally exposed.

Since the ground member is integral with the external panel, the number of components and manufacturing steps are greatly reduced, and positioning of the ground member during assembly is facilitated, as compared with a conventional structure in which the ground member and the external panel are discretely provided.

Preferably, the ground member spring-contacts the ground conductor portion of the circuit substrate.

Since the ground member is in spring-contact with the ground conductor portion of the circuit substrate, the assembly process is facilitated and performed in a greatly reduced amount of time as compared with the case in which both are soldered. The production efficiency is, therefore, greatly improved.

According to various preferred embodiments of the present invention, the information card includes an inner side of a conductor external panel of the information card electrically contacting the outer side of an external conductor of a connector contained in the information card to connect one to the other.

Accordingly, conduction between the external conductor of the connector and the external panel is more securely provided.

According to various preferred embodiments of the present invention, the information card includes a conductor external panel of the information card contacting a ground conductor portion of a circuit substrate contained in the information card to connect one to the other.

Accordingly, conduction between the ground conductor portion of the circuit substrate and the external panel is more securely provided.

According to other various preferred embodiments of the present invention, the information card includes a pair of ground members for covering an opposed pair of edges of a frame of the information card, the ground members being integral with a conductor external panel mounted to the frame, the external panel being electrically connected to a ground conductor portion of a circuit substrate contained in the information card, the ground members having hook portions opposed to each other in the ends of the ground members, and the tips of the hook portions having an interval shorter than the width of the frame.

Thus, since the ground member is integral with the external panel, advantages that are similar to those which are described above with respect to various preferred embodiments of the present invention are obtained. Further, since the hook portions opposed to each other are provided in the ends of the respective ground members, and the tips of the hook portions have an interval that is shorter than the width of the frame, the action of the hook portions cause the external panel and the frame to be fitted and joined. Thus, the production efficiency and the mechanical strength are greatly improved.

Preferably, the ground members cover substantially all of at least one of the paired edges opposed to each other of the frame.

Thus, since the ground member covers substantially all of the edge of the frame, the mechanical strength is greatly improved, and moreover, the conduction position of the ground member to the outside is flexibly designed.

According to various preferred embodiments of the present invention, the information card includes a seat member protruding in a direction opposed to a ground member disposed in an external panel of the information card.

Thus, since the seat member which protrudes in the direction opposed to the ground member is provided, the ground member has a reduced size, and moreover, when the ground member and a ground conductor portion on the seat member are conducted by spring-contact, the ground member has a high elastic force, and the reliability of conduction is greatly increased.

Preferably, the external panel is made of a nickel clad stainless steel material.

Thus, since the external panel is made of a nickel clad stainless steel material, contact resistance is greatly reduced when conduction is made by contact of a member extended from the external panel. Furthermore, since the wettability for solder is high, the external panel is reliably soldered.

Other features, elements, characteristics and advantages of the present invention will become apparent from the detailed description of preferred embodiments thereof with reference to the attached drawings.

BRIEF DESCRIPTION OF THE DRAWINGS

FIG. 2 is a cross sectional view showing an essential portion of the first preferred embodiment of the present invention.

DETAILED DESCRIPTION OF PREFERRED EMBODIMENTS

Figure 1:
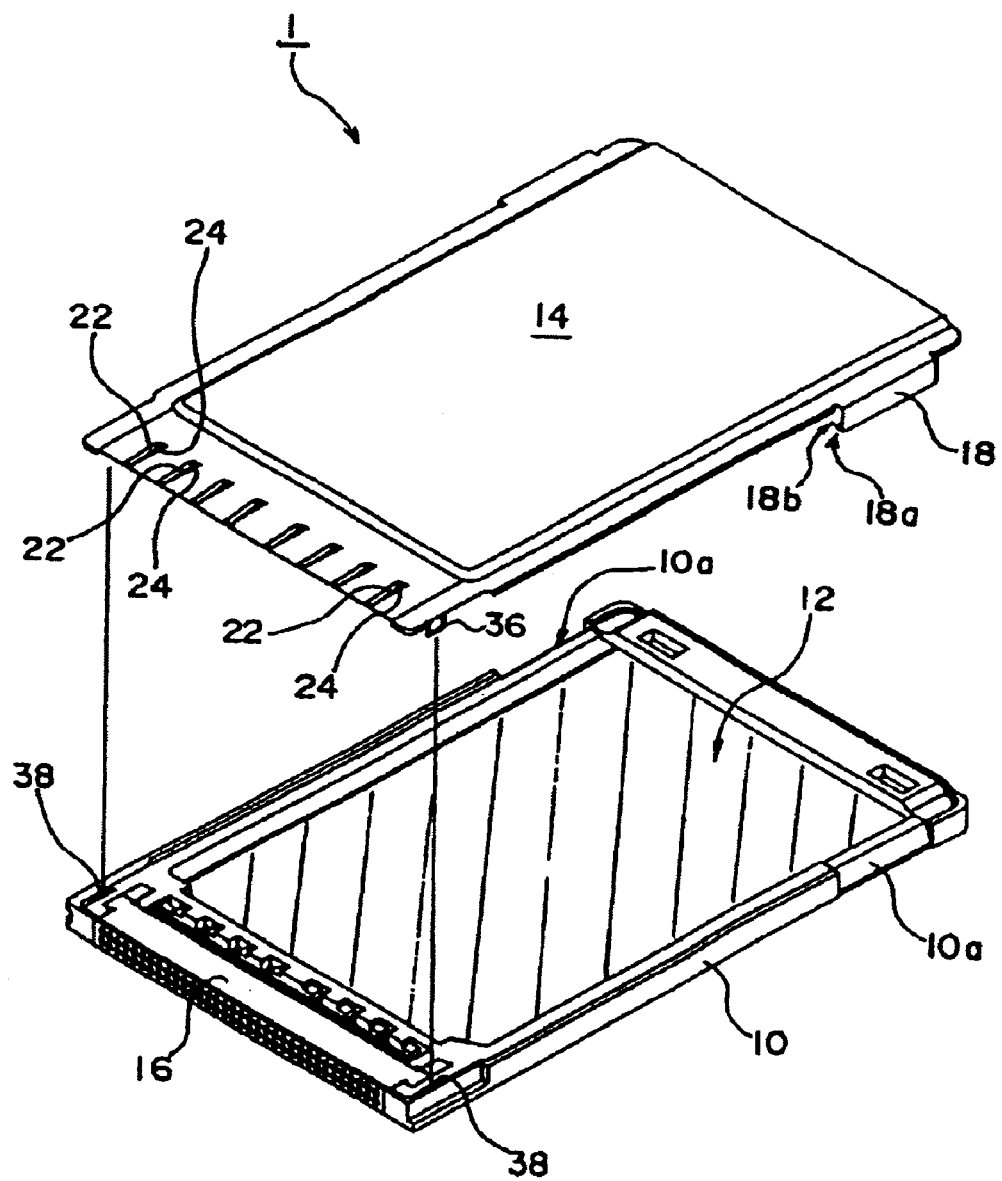
FIG. 1 is an exploded perspective view of an information card according to a first preferred embodiment of the present invention.

Hereinafter, preferred embodiments of the present invention will be described. In FIG. 1, an information card 1 according to a first preferred embodiment of the present invention is illustrated as a PC card in compliance with the above-mentioned PC Card Standard. A printed circuit 12 is housed inside of a frame 10 which is preferably made of an insulator such as resin or other suitable insulator, and the upper surface thereof is covered with an external panel 14. The printed substrate 12 is connected to a connector 16.

As shown in FIG. 2, a ground plate 20 is integral with the front end of the external panel 14. The ground plate 20 uses the front end of the external panel 14 as a base, and is bent in close contact with and on the lower surface of the external panel 14. The ground plate 20 is provided with a plurality of contacts 22. The contacts 22 are bent upward as viewed in the FIG. 2, and the middle portions thereof are substantially convex. The middle portions are exposed upward through windows 24 provided in the front end of the external panel 14. The lengths of the contacts 22 are greater than those of the windows 24. Accordingly, when a downward force as viewed in FIG. 2 is applied to the contacts 22, the contacts 22 are deflected downward. When no force is applied, the tips of the contacts 22 are constrained by the windows 24, such that the contacts 22 are normally maintained in the upwardly urged state.

Lead terminals 26 are integral with the end of the ground plate 20 and extend therefrom. The tips of the lead terminals 26 are bent downward as viewed in FIG. 2, are inserted through through-holes of the printed substrate 12, and are soldered to a ground conductor portion of the printed substrate 12.

FG terminals 18 are integral with the external panel 14, in the right and left side rear end portions of the external panel 14 as shown in FIGS. 1 and 3. The tips of the FG terminals 18 are bent inward, that is, are bent in the horizontal direction as viewed in FIGS. 1 and 3 to define hook portions 18a. Thus, the interval between the tips opposed to each other of the hook portions 18a is less than the width of the frame 10. Guide slopes 10a are provided in the portions of the frame 10 opposed to the hook portions 18a in the frame 10.

The tips of the hook portions 18a are bent upward to define engagement portions 18b. Engagement grooves 10b are provided in the portions of the frame 10 opposed to the engagement portions 18b, corresponding to the shapes and sizes of the engagement portions 18b.

Figure 4:
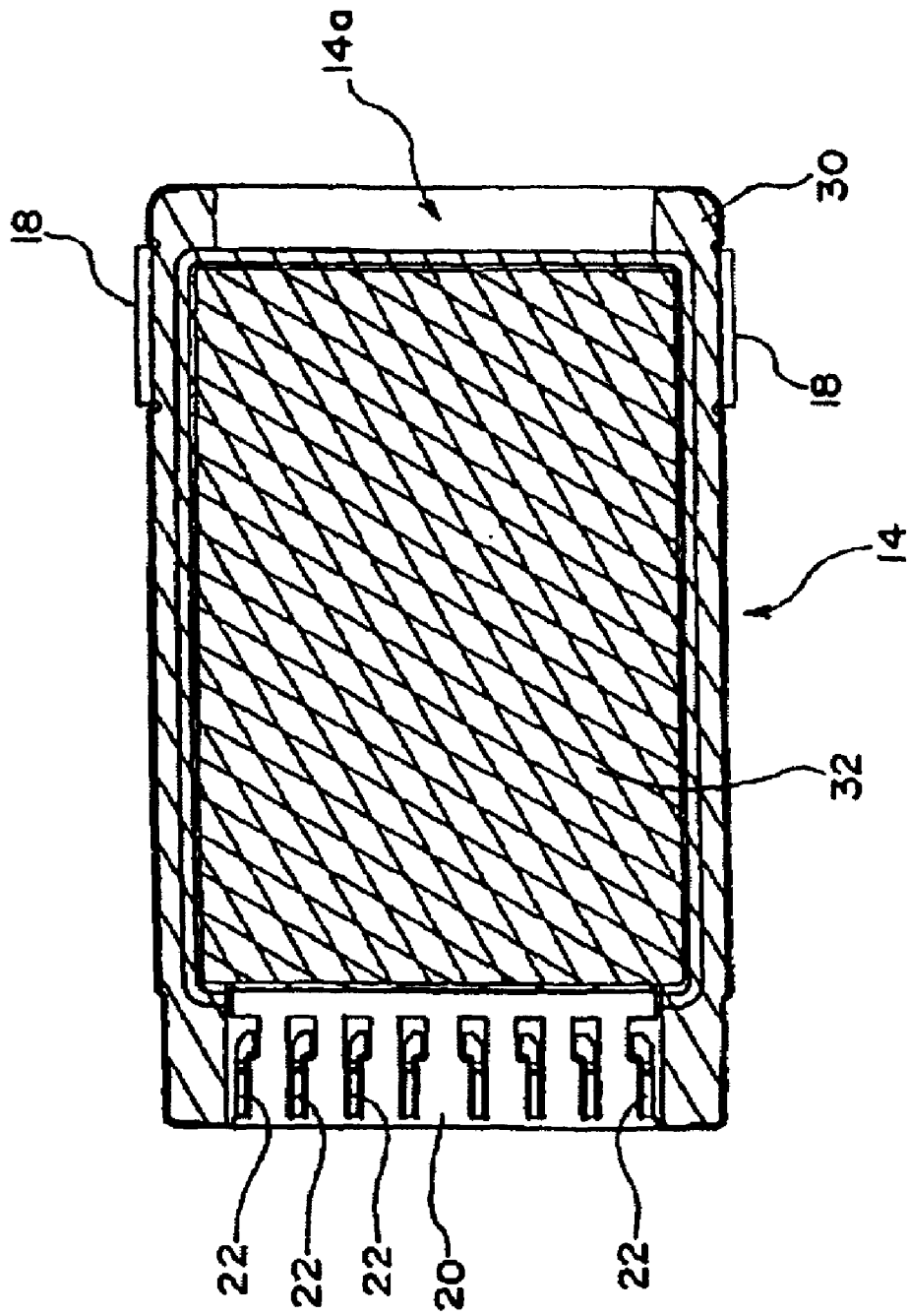
FIG. 4 is a plan view showing the lower surface of an external panel of the first preferred embodiment of the present invention.
Figure 5:
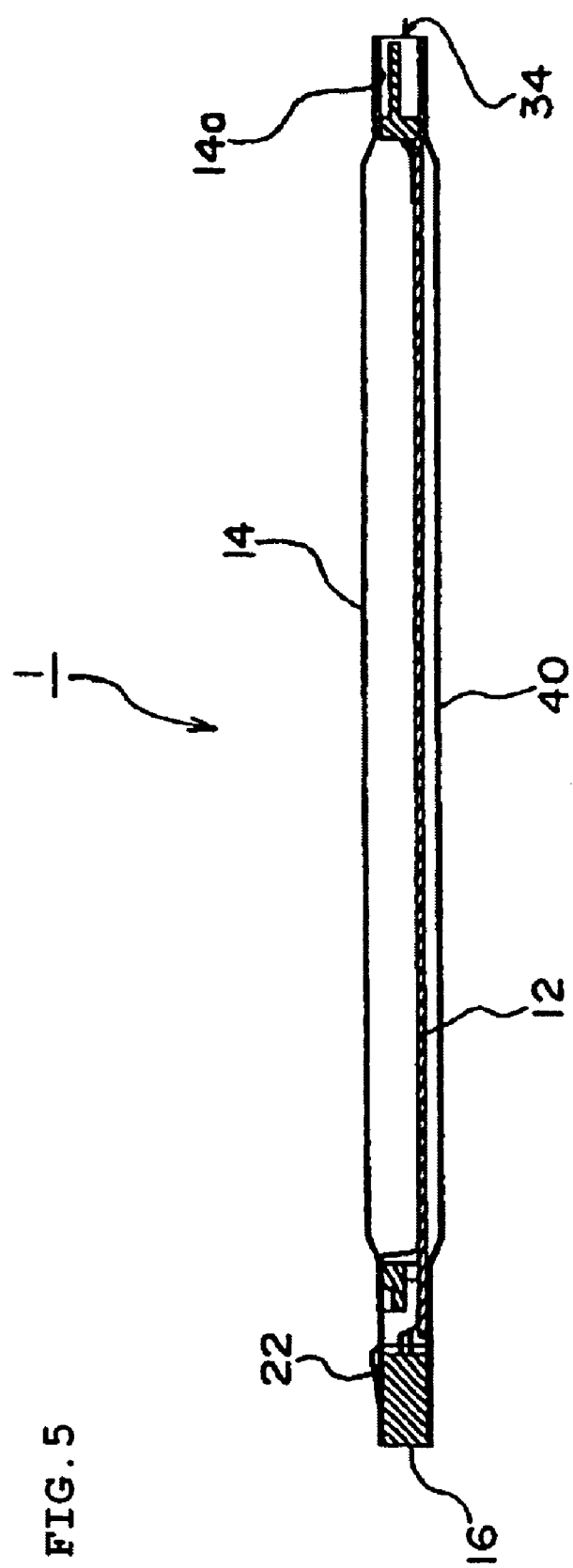
FIG. 5 is a cross sectional view showing the assembled state of the first preferred embodiment of the present invention.

As shown in oblique lines of FIG. 4, a thermal press bonding sheet 30 is bonded to the lower surface of the external panel 14, which is the inside surface thereof in the assembled state of the information card 1, by temporary thermal press bonding or application of slight pressure. Notches are provided in the thermal press bonding sheet 30, such that the rear end 14a of the external panel 14 is exposed. This rear end 14a comes into contact with the shell of a back connector 24 in the assembled state, as shown in FIG. 5.

A separator 32 of the thermal press bonding sheet 30 remains unreleased in the portions of the sheet 30 shown by the lattice pattern oblique lines in FIG. 4. Thus, insulation is performed in the portions of the sheet 30 opposed to the upper surface of the printed circuit 12 in the assembled state.

Referring to FIG. 1 again, substantially quadrangular frame connectors 36 are provided on the right and left edges in the front end portion of the external panel 14, and are bent downward. The connectors 36 are inserted into connecting groove 38 provided at the opposed portions of the frame 10. Thus, the substantially quadrangular connectors 36 are engaged with internal protuberances of the connecting grooves 38, due to the elastic force of the connectors 36, such that the external panel 14 and the frame 10 are fixed to each other.

The external panel 14, the FG terminals 18, and the ground plate 20 are preferably formed by pressing a nickel clad stainless steel sheet material.

Figure 3A:
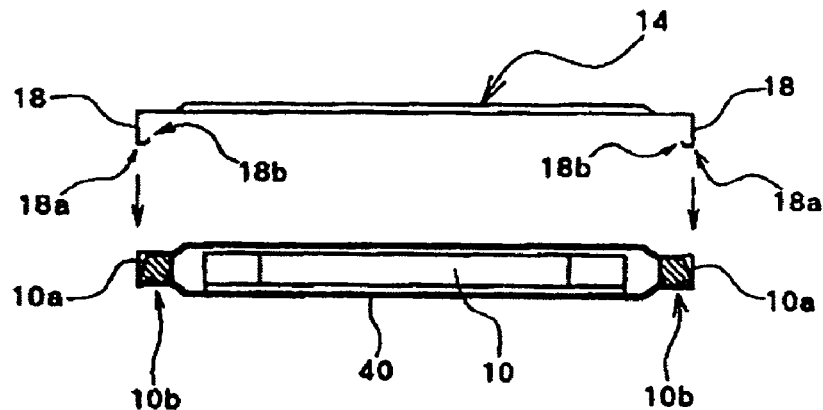
FIGS. 3A to 3D are cross sectional views showing assembly processes of the first preferred embodiment of the present invention.
Figure 3B:
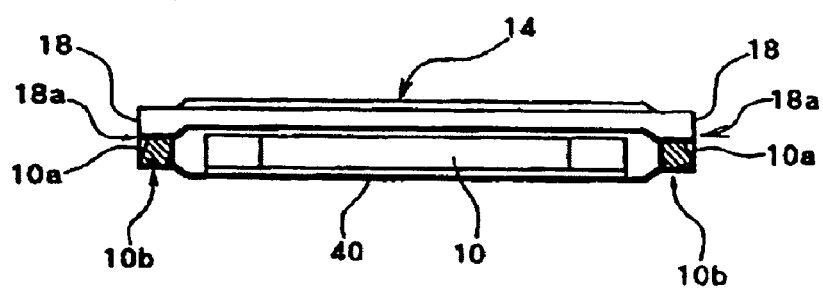

An assembly process for the information card 1 configured as described above will be described. First, as shown in FIG. 3A, the external panel 14 is opposed to the frame 10. Then, as shown in FIG. 3B, when the external panel 14 is lowered, the FG terminals 18 of the external panel 14 are slid on the guide slopes 10a of the frame 10.

Figure 3C:
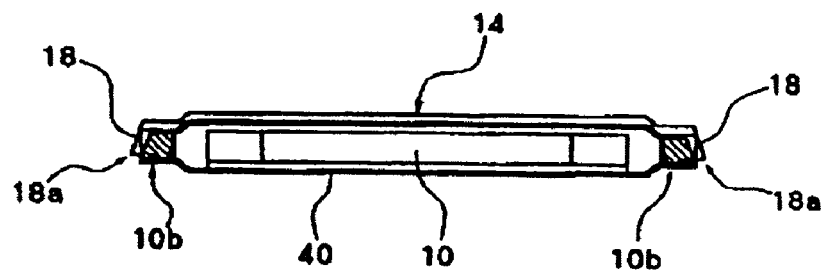

When the external panel 14 is further lowered as shown in FIG. 3C, the hook portions 18a on the right and left sides are guided by the guide slopes 10a, and the hook portions 18a are expanded outwardly against the elastic force.

Figure 3D:
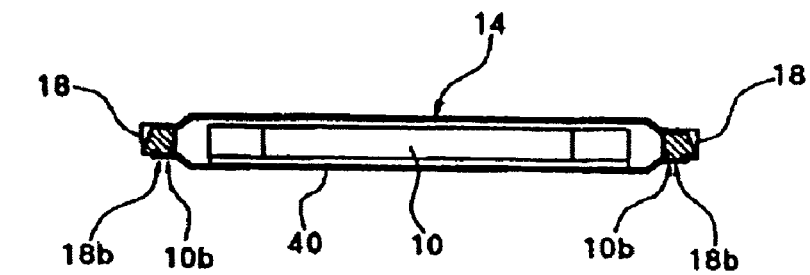

Then, when the external panel 14 is lowered to the final position shown in FIG. 3D, the hook portions 18e return to their original postures, such that the engagement portions 18b in the tips become engaged with the engagement grooves 10b opposed thereto, and thereby, the external panel 14 is fixed to the frame 10.

After this state, the lead terminals 26 of the ground plate 20 are inserted into the through-holes of the printed substrate 12, and are soldered to the ground conductor portion of the printed substrate 12. Finally, a lower surface external panel 40 is fixed by an appropriate fixing member from the lower surface side to complete the assembly.

In the information card 1 configured as described above, the ground plate 20 connected to the ground conductor portion of the printed substrate 12 is integral with the external panel 14. Thus, the number of components and required process steps are greatly reduced as compared with the conventional configuration in which the ground plate 20 and the external panel 14 are discretely provided. In addition, in assembly, positioning of the ground plate 20 with respect to the printed substrate 12 is greatly facilitated.

This preferred embodiment includes the rear end 14a of the lower surface of the external panel 14 being exposed as shown in FIG. 4. The rear end 14a comes into contact with the shell of the back connector 34 in the assembled state, as shown in FIG. 5. Connection between the shell of the back connector 34 and the external panel 14 is easily secured.

Furthermore, in this preferred embodiment, the FG terminals 18 are integral with the external panel 14. Thus, the number of components and required assembly process steps are greatly reduced, and positioning of the FG terminals 18 is greatly facilitated. Moreover, the hook portions 18a opposed to each other are provided in the tips of the FG terminals 18, respectively, and the interval between the tips of the hook portions 18a is less than the width of the frame 10. Accordingly, the external panel 14 and the frame 10 are fitted and joined together, due to the action of the hook portions 18a. Thus, the production efficiency and the mechanical strength are greatly improved.

In this preferred embodiment, the external panel 14 is made of a nickel clad stainless steel material. Therefore, where conduction is achieved by contact of a member extended from the external panel 14, the contact resistance is greatly reduced. Furthermore, the external panel 14 has a good wettability for solder, and can be suitably soldered.

Figure 6:
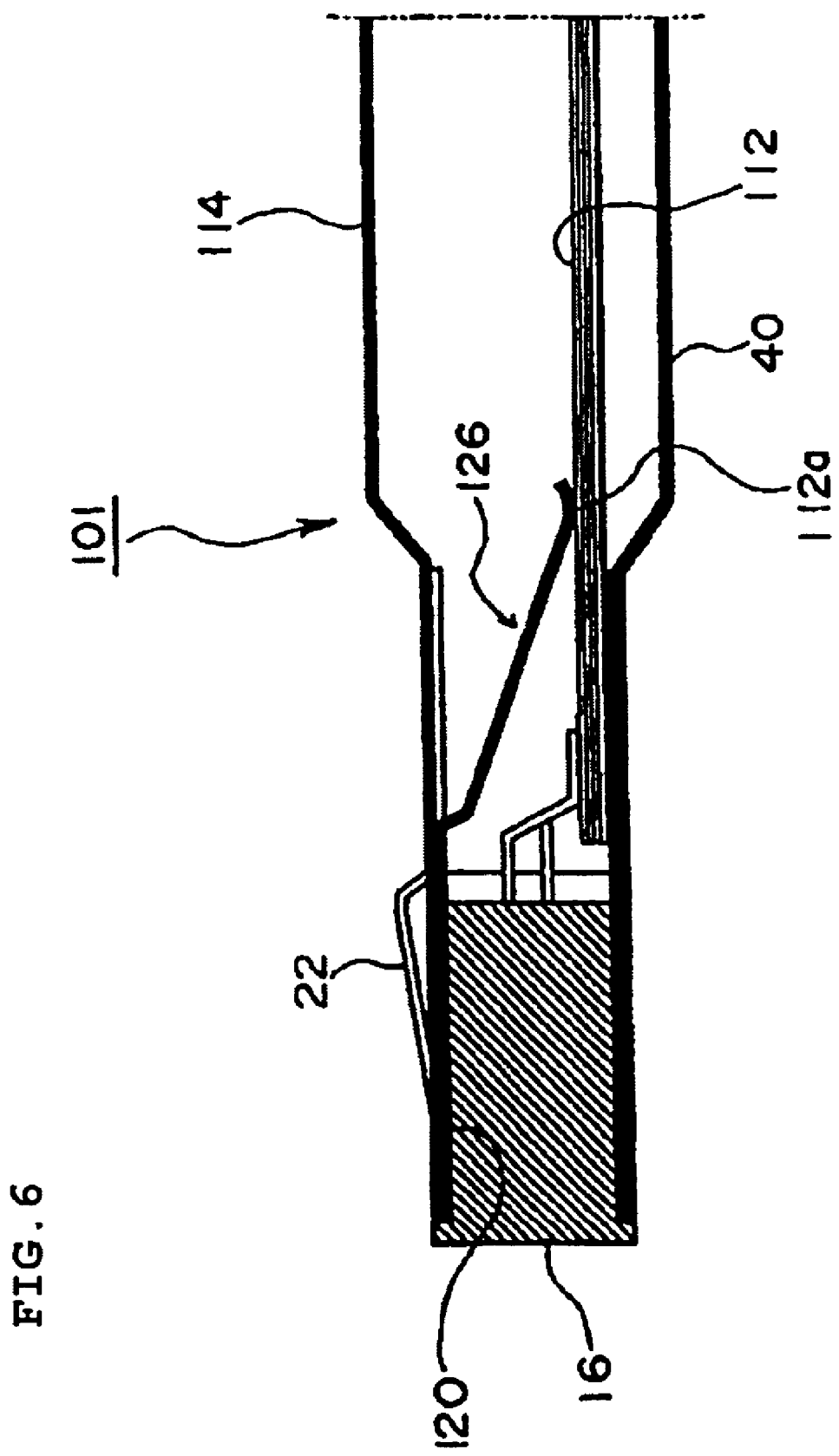
FIG. 6 is a cross sectional view showing an essential portion of a second preferred embodiment of the present invention.
Figure 7:
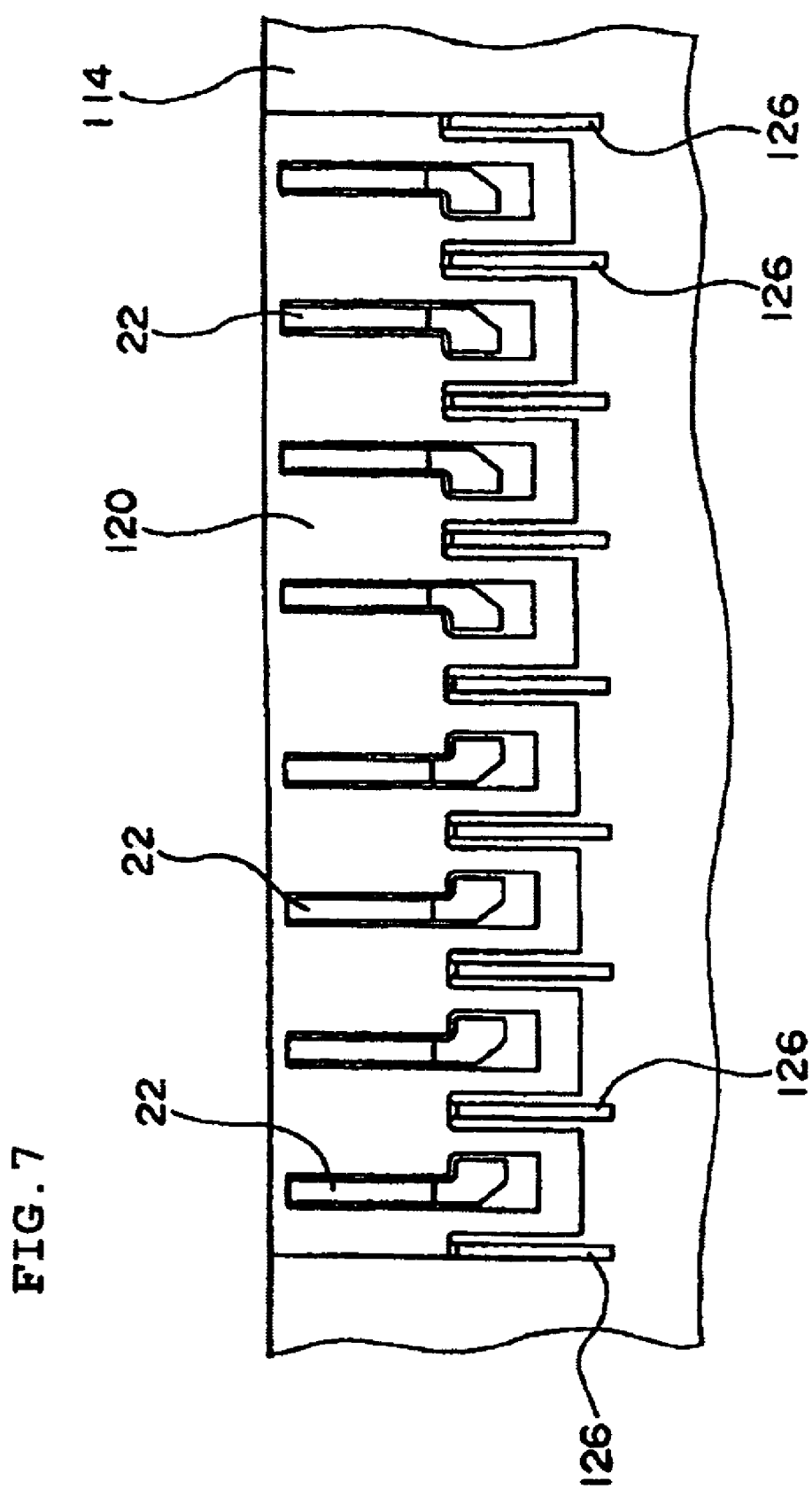
FIG. 7 is a plan view showing an essential portion of a ground plate of the second preferred embodiment of the present invention.

Hereinafter, a second preferred embodiment will be described. In FIG. 6, in an information card 101 of the second preferred embodiment, a ground plate 120 is integral with an external panel 114 in the front end of the external panel 114. Lead terminals 126 extend from the ground plate 120, which is integral therewith. The lead terminals 126 are bent downward, and the tips thereof spring-contact lands 112a which are the ground conductor portions of a printed substrate 112. FIG. 7 is a plan view of the ground plate 120. As shown in FIG. 7, the base portions of the lead terminals 126 are arranged alternately with contacts 22. The remaining configuration of the second preferred embodiment is preferably similar to that of the first preferred embodiment. Thus, the description is omitted to avoid repetition.

In this preferred embodiment, the lead terminals 126 of the ground plate 120 spring-contact the lands 112a. Accordingly, as compared with the case in which both of the lead terminals 126 and the lands 112a are soldered, the assembly is greatly facilitated, and assembly time is greatly reduced. Thus, the production efficiency is greatly improved. Moreover, in this preferred embodiment, the base portions of the lead terminals 126 are arranged alternately with the contacts 22. Therefore, the lengths of the lead terminals 126 are increased, and thereby, spring forces of the lead terminals 126 are greatly increased, increasing the reliability of conduction.

Figure 8:
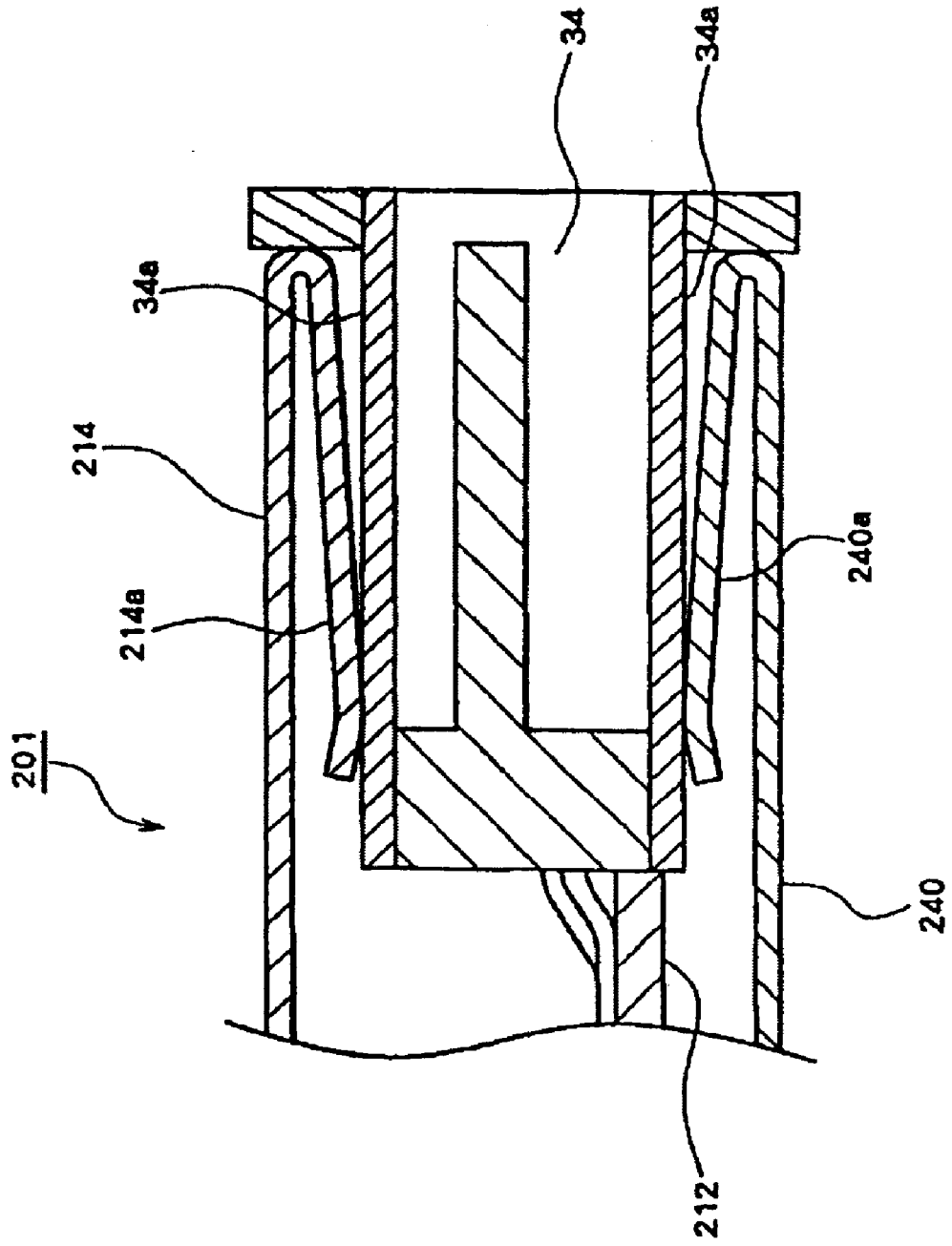
FIG. 8 is a side view showing an essential portion of a third preferred embodiment.
Figure 9:
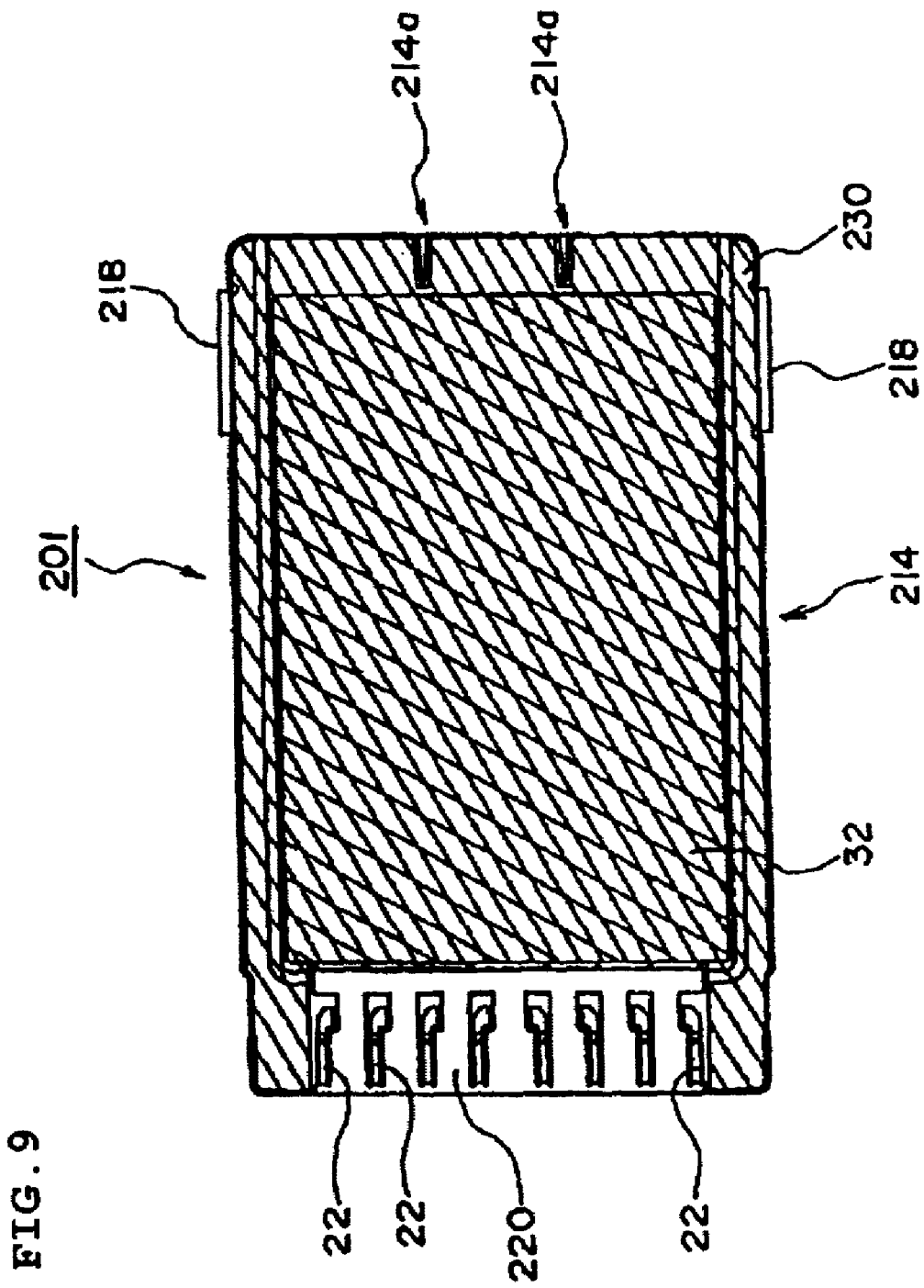
FIG. 9 is a plan view showing the lower surface of an external panel of the third preferred embodiment of the present invention.

Hereinafter, a third preferred embodiment will be described. In FIGS. 8 and 9, an information card 201 of the third preferred embodiment includes contacts 214a provided in the rear end of an external panel 214 which are bent to the lower surface side, that is, on the inner surface side in the assembly state. Similar contacts 240a are provided on a lower surface panel 240, and are bent to be the upper surface side. Notches surrounding the contacts 214a are provided on a thermal press bonding sheet 230 bonded to the external panel 214, respectively. The contacts 214a are exposed therethrough. The remaining configuration is the same as that of the first preferred embodiment.

Accordingly, in the third preferred embodiment, the contacts 214a and 240a contact the shells 34a of the back connectors 34 in the assembly state. Thus, in this preferred embodiment, the external panel 214 and the shells 34a are securely conducted to each other, and not dependent on the assembly accuracy. Thus, the reliability of conduction is greatly enhanced.

In the third preferred embodiment, the contacts 214a integrally extending from the external panel 214 are connected to the shells 34a of the back connectors 34, and the shells 34a are connected to the ground conductor layer of a printed substrate 212. Therefore, the entire external panel 214 is grounded. Instead of this configuration, appropriate contacts extending from the external panel 214 may directly contact the ground conductor layer of the printed substrate 212 or may be soldered thereto such that the external panel 214 is grounded. To the contrary, the shells of the connectors may include contacts, which contact the inner surface of the external panel.

Figure 10:
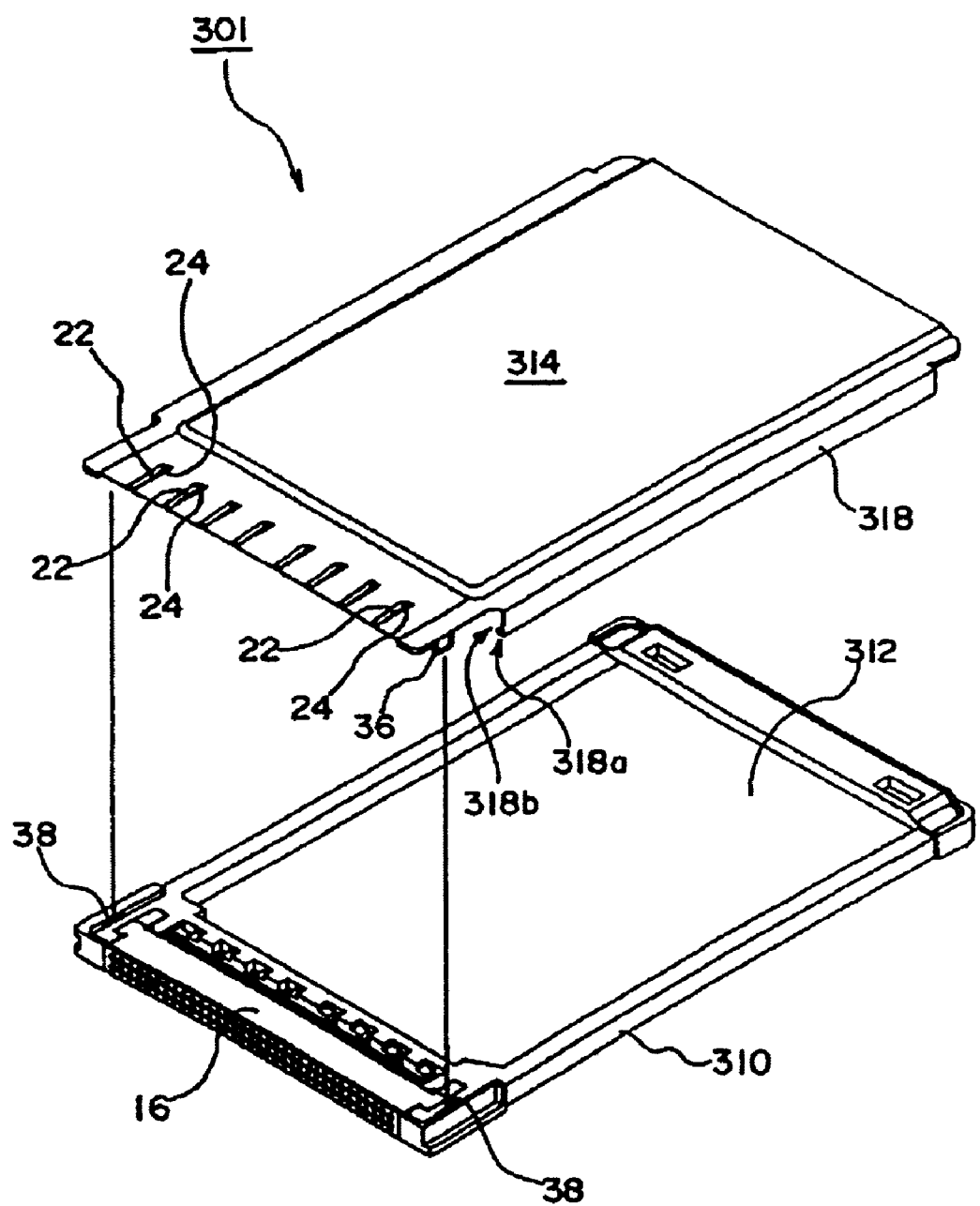
FIG. 10 is an exploded perspective view of an information card of a fourth preferred embodiment of the present invention.

Hereinafter, a fourth preferred embodiment will be described. In FIG. 10, an information card 301 of the fourth preferred embodiment includes FG terminals 318 which cover both of the side ends of a frame 310. The FG terminals 318 are integral with an external panel 314. The respective tips of the FG terminals 318 are bent inward, that is, are bent in the horizontal direction as viewed in FIG. 10 to define hook portions 318a. Furthermore, the tips of the hook portions 318a are bent upward to define engagement portions 318b. Engagement grooves (not shown) corresponding to the shape and size of the engagement portions 318b are provided at the portions on the lower surface of the frame 310 which are opposed to the engagement portions 318b. The remaining configuration is preferably similar to that of the first preferred embodiment.

In the fourth preferred embodiment, the FG terminals 318 cover substantially the entire sides of the frame 310. Therefore, the mechanical strength is greatly improved, and moreover, the external conduction positions of the FG terminals 318 can be flexibly designed via the FG terminals 318. In this preferred embodiment, the FG terminals 18 cover the entire sides of the frame 310. However, instead of the configuration, the FG terminals 18 may cover substantially all of one of the sides of the frame 310, and partially cover the other side. Furthermore, the other side may have only an engagement function, and not act as a terminal. In these cases, the same advantages as those of the fourth preferred embodiment are obtained on the relevant one side.

Figure 11:
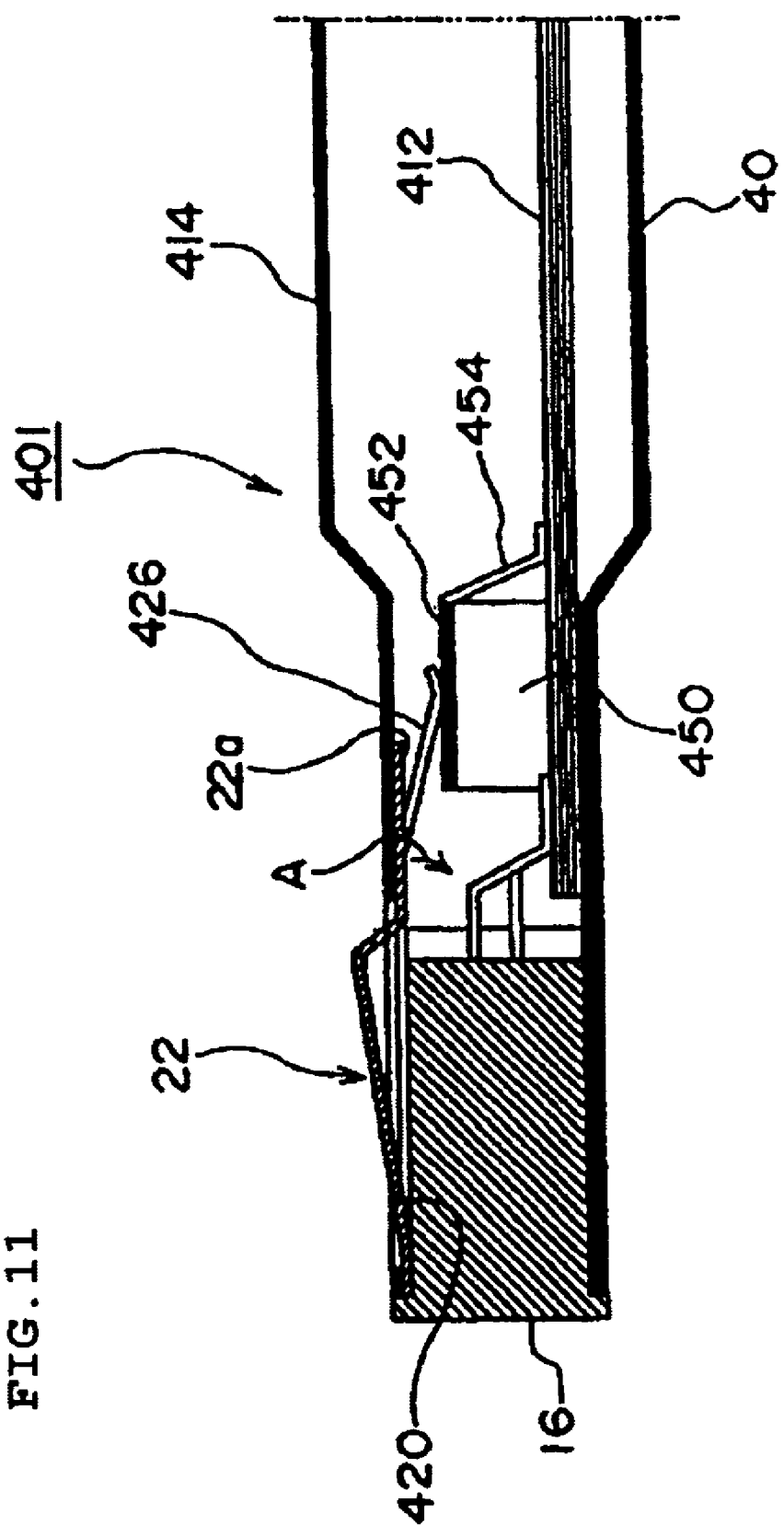
FIG. 11 is a cross sectional view showing an essential portion of a fifth preferred embodiment of the present invention.
Figure 12:
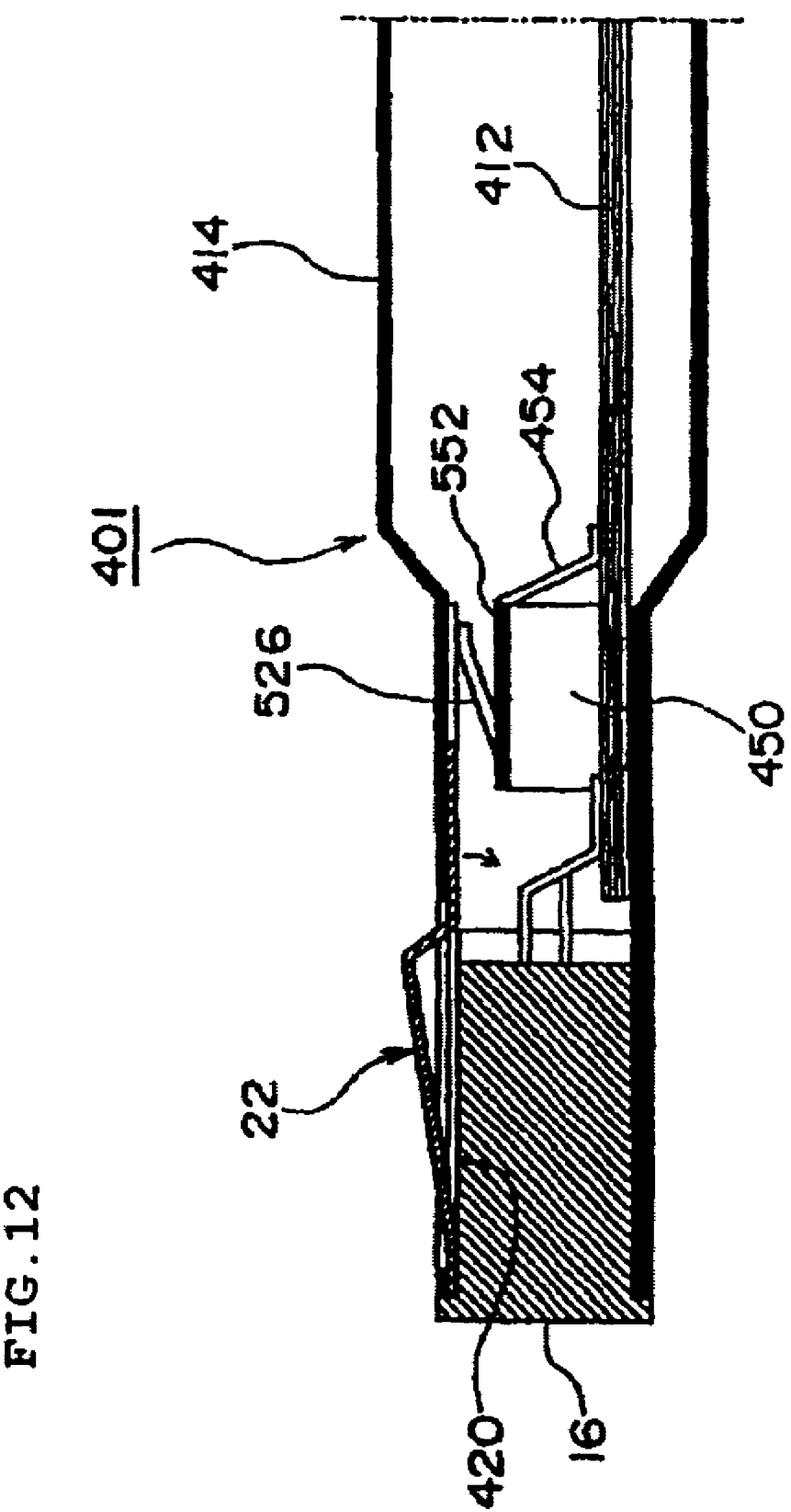
FIG. 12 is a cross sectional view showing an essential portion of a modification example of the fifth preferred embodiment of the present invention.
Figure 13:
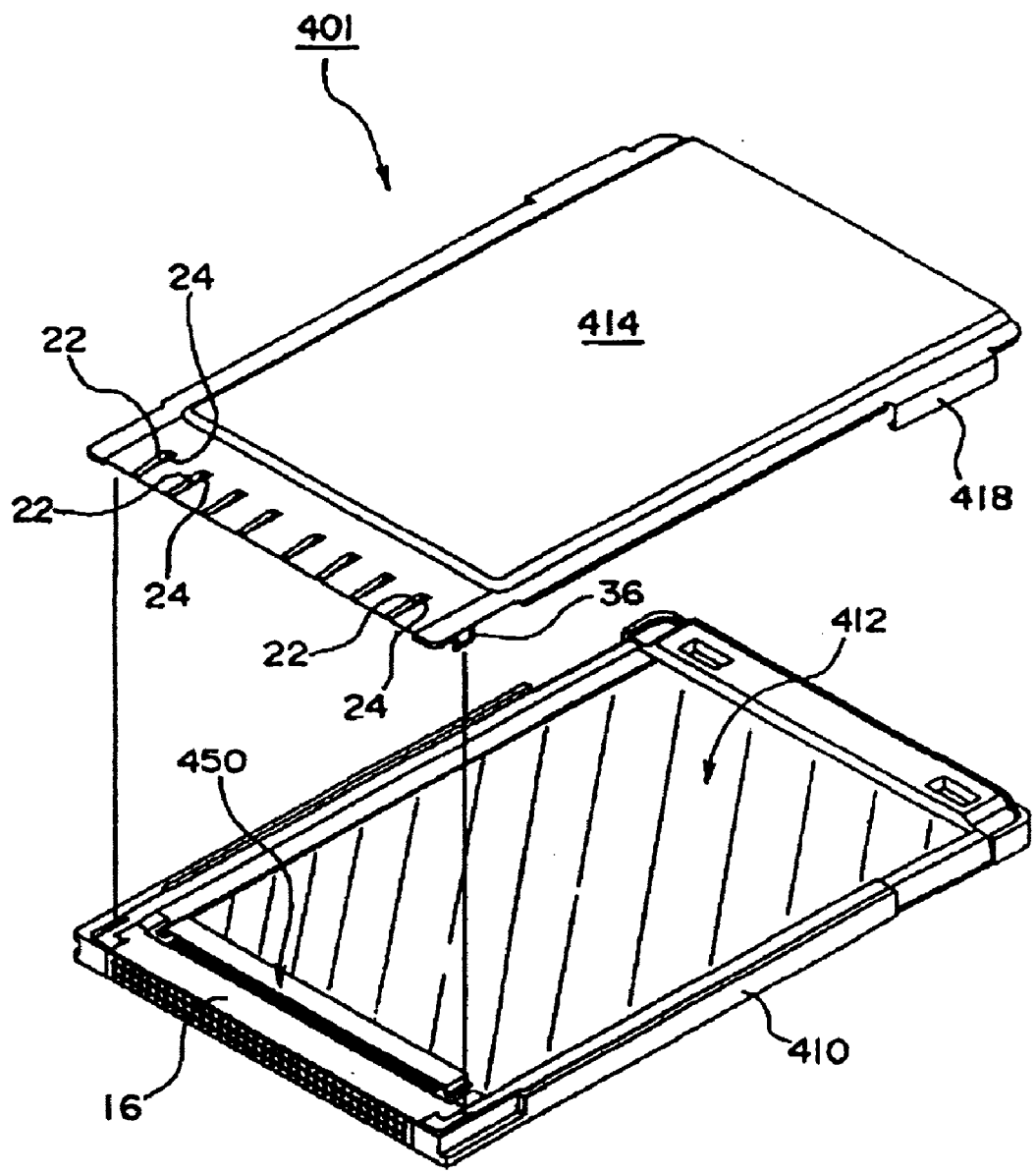
FIG. 13 is an exploded perspective view of an information card of the fifth preferred embodiment of the present invention.

Hereinafter, a fifth preferred embodiment will be described. In FIGS. 11 and 13, an information card 401 of the fifth preferred embodiment includes seat members 450 which are provided on the upper surface of a printed substrate 412, the seat members protrude in the direction opposed to a ground plate 420. Conductor layers 452 are provided on the upper surfaces of the seat members 450, respectively. The conductor layers 452 are connected to the ground conductor layer in the printed substrate 412 via lead wires 454.

Lead terminals 426 extend from and are integral with the ground plate 420 which is integral provided in the front end of an external panel 414. The tips of the lead terminals 426 are bent downward as viewed in FIG. 11, and elastically spring-contact the conductor layers 452 of the seat members 450, respectively.

Furthermore, the seat members 450 are provided in portions such that when force is applied to contacts 22 to turn them downward (that is, in the direction indicated by arrow A), the tips of the contacts 22 come in contact with the seat members 450.

As described above, in the fifth preferred embodiment, the seat members 450 protruding in the direction opposed to the ground plate 420 are provided. Thus, the length of the lead terminals 426 is greatly reduced, and moreover, the lead terminals 426 have a large elastic force. That is, the reliability of conduction is greatly improved.

Moreover, in the fifth preferred embodiment, the seat members 450 are positioned to interfere with the contacts 22, when they are turned downward. Thus, the downward-turning of the contacts 22 is constrained by the seat members 450, respectively, which prevents the contacts from short-circuiting to the printed substrate 412.

In the fifth preferred embodiment, the lead terminals 426 are provided for the ground plate 420. Instead of this configuration, lead terminals 526 using the conductor layers 552 of the seat members 450 as base may be provided, protruding obliquely upward, and spring-contact the ground plate 420. Moreover, the seat members 450 may be provided not on the printed substrate 412 but on the frame. Furthermore, a portion of the other members such as the connector 16 may be utilized to define the seats.

Figure 14:
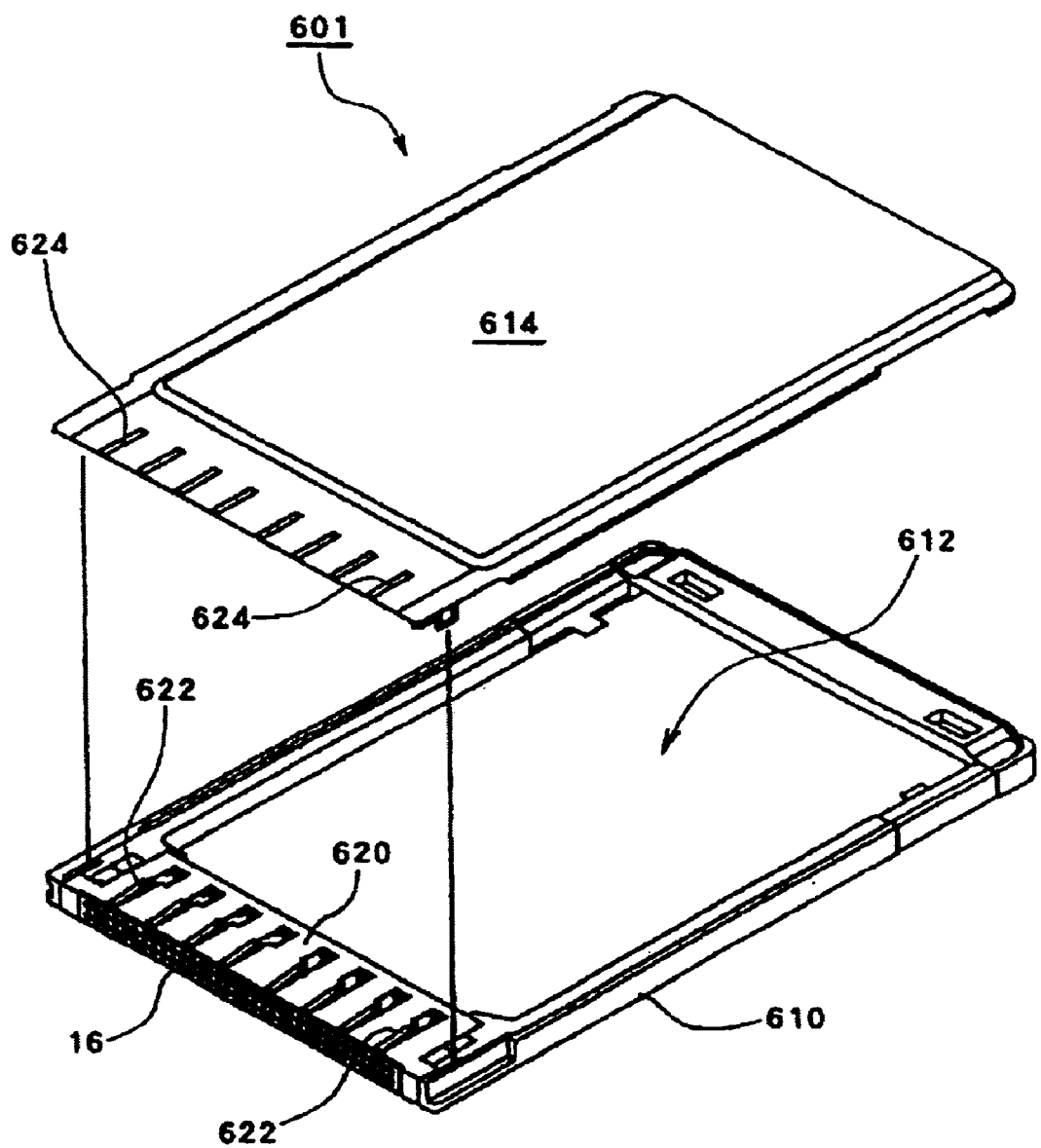
FIG. 14 is an exploded perspective view of an information card of a sixth preferred embodiment of the present invention.
Figure 15:
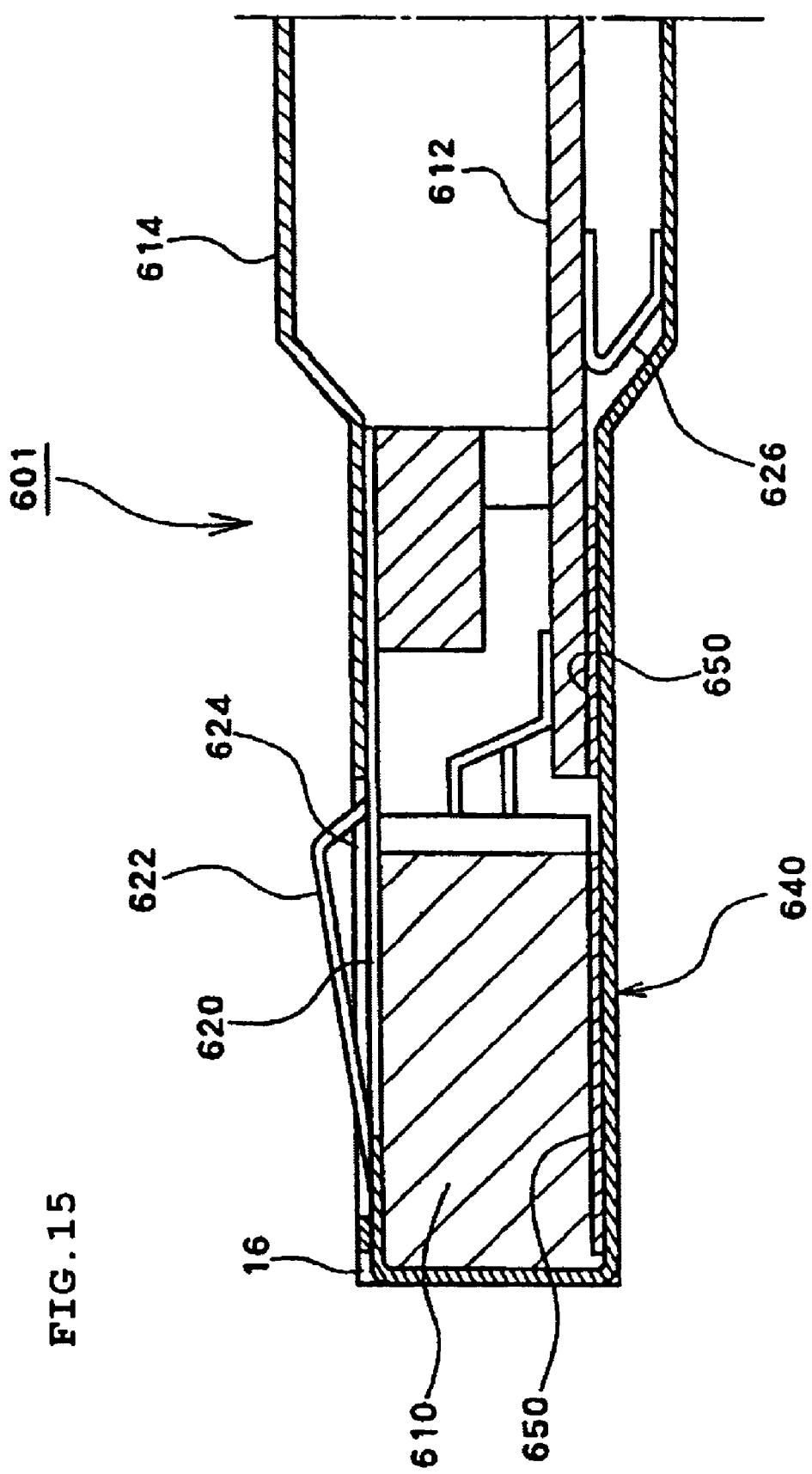
FIG. 15 is a cross sectional view showing an essential portion of the sixth preferred embodiment of the present invention.
Figure 16:
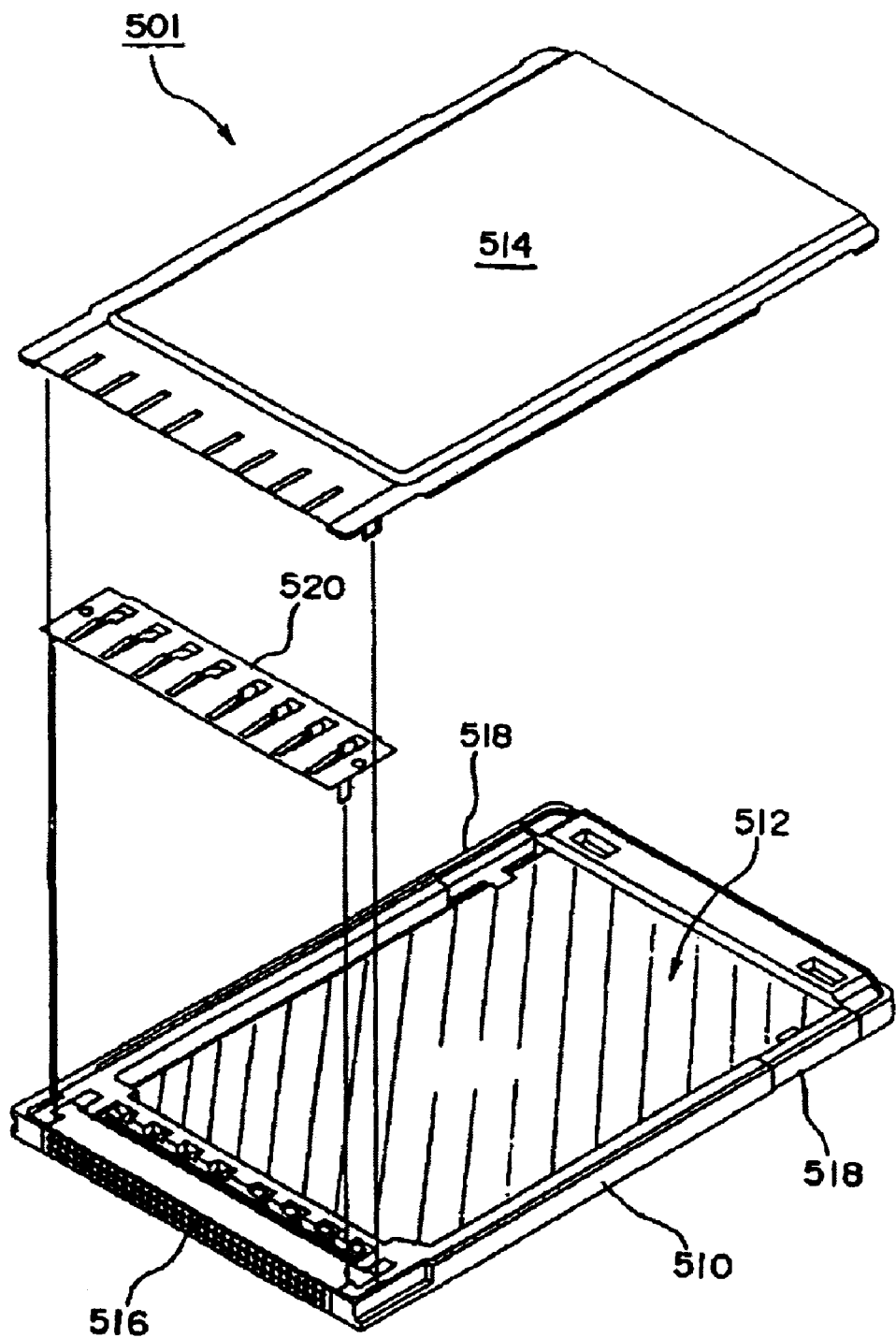
FIG. 16 is an exploded perspective view of a conventional information card.

Hereinafter, a sixth preferred embodiment will be described. In an information card 601 of the sixth preferred embodiment shown in FIGS. 14 and 15, a ground plate 620 is integral with a lower surface external panel 640 in the front end thereof. That is, as shown in FIG. 15, the ground plate 620 integrally extending from the front end of the lower surface external panel 640 utilizes the front end of the lower surface external panel 640 as a base, and is bent upward to cover the front surfaces of a frame 610 which are on the right and left sides of the front end of the connector 16, and the tips of the ground plate 620 are bent horizontally along the upper surface of the frame 610. A plurality of contacts 22 are provided with the ground plate 620. The middle portions of the contacts 622 formed into convexities are exposed out of windows 624 provided in the front end of the external panel 614.

The lower surface external panel 640 is bonded via solder 650 to the lower surface of a printed substrate 612 and the outside of the connector 16. Instead of the solder 650, a conductive sheet may be provided.

In the sixth preferred embodiment, the ground plate 620 connected to the ground conductor portion of the printed substrate 612 is integral with the lower surface external panel 640. Accordingly, similarly to the first preferred embodiment, the number of components and required assembly process steps are greatly reduced, and moreover, positioning of the ground plate 620 with respect to the printed substrate 612 in assembly is greatly facilitated.

In the sixth preferred embodiment, conduction between the lower surface external panel 640 and the printed substrate 612 is achieved via solder 650 or the conductive sheet. Instead of this configuration, or in addition to this configuration, a ground metal device for elastically contacting the ground conductor layer of the printed substrate 612 and the lower surface external panel 640 may be used. This further enhances the reliability of conduction.

In the respective preferred embodiments, the external panel is preferably constructed of a nickel clad stainless steel material. Other materials, provided that they are conductors, may be used as the material of the external panel. That is, nickel silver copper, phosphor bronze, or other suitable material can be used.

According to a first aspect of various preferred embodiments of the present invention, the ground member is provided integrally with the external panel. Therefore, the number of components and required assembly process steps are greatly reduced, and positioning of the ground member in assembly is greatly facilitated, as compared with a conventional structure in which the ground member and the external panel are discretely provided.

Preferably, the ground member spring-contacts the ground conductor portion of the circuit substrate. Therefore, the assembly is greatly facilitated and assembly time is greatly reduced as compared with the case in which both are soldered. The production efficiency is greatly improved.

Moreover, conduction between the external conductor of the connector and the external panel is easily secured.

Furthermore, conduction between the ground conductor portion of the circuit substrate and the external panel is easily secured.

Moreover, since the ground member is integral with the external panel, similar advantages to those according to the first aspect of various preferred embodiments of the present invention are achieved. Further, since the hook portions opposed to each other are provided in the tips of the respective ground members, and the tips of the hook portions have an interval less than the width of the frame, the action of the hook portions causes the external panel and the frame to be fitted and joined. Thus, the production efficiency and the mechanical strength are greatly improved.

Preferably, since the ground member preferably covers substantially all of the edge of the frame, the mechanical strength is greatly improved, and moreover, the conduction position of the ground member to the outside can be flexibly designed.

Also, since the seat member is preferably provided which protrudes in the direction opposed to the ground member disposed in the external panel of the information card, the size of the ground member can be greatly reduced, and moreover, when the ground member and a ground conductor portion on the seat member are conducted by spring-contact, the ground member has a high elastic force, and the reliability of conduction is greatly increased.

Since the external panel is preferably made of a nickel clad stainless steel material, contact resistance is greatly reduced when conduction is made by contact of a member extended from the external panel. Furthermore, since the wettability for solder is high, the external panel is effectively and securely soldered.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. An information card comprising:
   a conductive external panel;
   a ground member that is integral with said external panel; and
   a circuit substrate having a ground conductor portion; wherein
   said ground member is connected to said ground conductor portion of said circuit substrate contained in the information card and is externally exposed.

2. An information card according to claim 1, wherein the ground member spring-contacts the ground conductor portion of the circuit substrate.

3. An information card according to claim 1, wherein the external panel is made of a nickel clad stainless steel material.

4. An information card according to claim 1, wherein said ground member is connected to said ground conductor portion of said circuit substrate via through-holes provided in said ground conductor portion.

5. An information card according to claim 1, further comprising seat members provided on an upper surface of said circuit substrate, wherein said ground member spring-contacts said seat member.

6. An information card according to claim 1, wherein said ground member includes plural contacts which are exposed at the upper side of said external panel via windows provided in said external panel.

7. An information card comprising:
   a conductive external panel;
   a connector including an external conductor; and
   a conductive shell disposed on the perimeter of said external conductor; wherein
   an inner side of said conductive external panel contacts an outer side of the conductive shell disposed on the perimeter of said external conductor.

8. An information card according to claim 7, wherein the external panel is made of a nickel clad stainless steel material.

9. An information card comprising:
   a conductive external panel;
   an elastic conductive member; and
   a circuit substrate having a ground conductor portion; wherein
   the elastic conductive member connects said conductive external panel and said ground conductor portion of said circuit substrate.

10. An information card according to claim 9, wherein the external panel is made of a nickel clad stainless steel material.

11. An information card comprising:
    a frame;
    a conductive external panel mounted on the frame;
    a circuit substrate contained in the information card and having a ground conductor portion;
    a pair of ground members for covering a pair of the edges opposed to each other of a frame of the information card, the ground members being integral with said conductive external panel; wherein
    said conductive external panel is electrically connected to said ground conductor portion of said circuit substrate contained in the information card, said ground members having hook portions opposed to each other in the ends of the ground members, and the tips of the hook portions having an interval shorter than the width of the frame.

12. An information card according to claim 11, wherein the external panel is made of a nickel clad stainless steel material.

13. An information card according to claim 11, wherein the ground members cover substantially all of at least one of the pair of edges opposed to each other of the frame.

14. An information card according to claim 11, wherein the ground members cover substantially all of both of said pair of edges opposed to each other of the frame.

15. An information card according to claim 11, wherein said pair of edge opposed to each other of the frame include guide slope.

* * * * *